United States Patent [19]

Kukanskis et al.

[11] Patent Number: 4,921,571
[45] Date of Patent: May 1, 1990

[54] INHIBITED COMPOSITION AND METHOD FOR STRIPPING TIN, LEAD OR TIN-LEAD ALLOY FROM COPPER SURFACES

[75] Inventors: Peter E. Kukanskis, Woodbury; Bryan Whitmore, New Haven, both of Conn.

[73] Assignee: MacDermid, Incorporated, Waterbury, Conn.

[21] Appl. No.: 386,887

[22] Filed: Jul. 28, 1989

[51] Int. Cl.$^5$ .......................... B44C 1/22; C23F 1/00; C03C 15/00; C03C 25/06
[52] U.S. Cl. .................... 156/656; 156/664; 156/902; 252/79.4
[58] Field of Search .............. 252/79.2, 79.4, 146, 252/148, 149; 134/3, 41; 156/633, 634, 640, 655, 656, 664, 902

[56] References Cited

U.S. PATENT DOCUMENTS

| | | | |
|---|---|---|---|
| 3,677,949 | 7/1972 | Brindisi, Jr. | 252/79.4 |
| 3,926,699 | 12/1975 | Dixon | 156/3 |
| 3,990,982 | 11/1976 | Dixon | 252/79.3 |
| 4,004,956 | 1/1977 | Brindisi, Jr. | 156/666 |
| 4,297,257 | 10/1981 | Elias et al. | 260/29.6 |
| 4,306,933 | 12/1981 | Da Fonte, Jr. | 156/644 |
| 4,374,744 | 2/1983 | Kawanabe et al. | 252/79.4 |
| 4,397,753 | 8/1983 | Czaja | 252/79.3 |
| 4,424,097 | 1/1984 | Lipka et al. | 156/656 |
| 4,439,338 | 2/1984 | Tomaiuolo et al. | 252/79.1 |
| 4,545,850 | 10/1985 | Nelson | 156/642 |
| 4,632,727 | 12/1986 | Nelson | 156/656 |
| 4,673,521 | 6/1987 | Sullivan et al. | 252/79.3 |
| 4,687,545 | 8/1987 | Williams et al. | 156/651 |
| 4,713,144 | 12/1987 | Schiller | 156/656 |

*Primary Examiner*—William A. Powell
*Attorney, Agent, or Firm*—St. Onge Steward Johnston & Reens

[57] ABSTRACT

A composition for stripping tin, lead or solder, as well as any underlying copper-tin alloy, from copper surfaces, containing an alkane sulfonic acid, preferably methane sulfonic acid, an inorganic nitrate, preferably ferric nitrate, and an inhibitor component. The composition effects rapid stripping without any appreciable formation of sludge or precipitate or suspended particles, and without any appreciable attack on the underlying copper surface.

17 Claims, No Drawings

INHIBITED COMPOSITION AND METHOD FOR STRIPPING TIN, LEAD OR TIN-LEAD ALLOY FROM COPPER SURFACES

BACKGROUND OF THE INVENTION

The present invention relates to compositions and methods for the stripping of tin, lead or tin-lead alloys (i.e., solder) from a copper metal surface, and more particularly to compositions and methods for treating tin-coated or lead-coated or solder-coated copper surfaces in the manufacture of printed circuit boards to strip the tin or lead or solder therefrom and expose the underlying copper metal.

In the course of manufacturing printed circuit boards, it is commonplace to deposit (e.g., by electroplating, immersion or other like processes) a layer of tin, lead or tin-lead alloy (solder) on all or selected conductive copper surfaces of the board defining traces, through-holes, surrounding pad areas and the like, to serve, for example, as an etch resist in the subsequent etching away of other copper surfaces. By the same token, it is necessary to eventually strip the tin or lead or tin-lead alloy from all or selected copper surfaces coated therewith, as is needed for example when it is desired to place certain copper surfaces (e.g., contact fingers) with nickel and/or gold to improve conductivity, or when it is desired to apply a solder mask over bare copper surfaces (SMOBC processes), or when it may be necessary simply to treat a reject piece in an effort to recover and re-use the underlying copper material. Also, while particularly apropos of printed circuit board manufacture, the need to strip away tin, lead or tin-lead layers from copper surfaces also arises in other contexts where tin, lead or tin-lead has been applied over a copper surface for decorative and/or functional purposes.

In addition, when copper metal surfaces are coated with tin or tin-lead alloys, a thin layer or film of copper-tin alloy (or intermetallic) typically forms at the layer interface, which film progressively increases in thickness with time. Accordingly, in processes designed to strip away the tin or tin-lead layer to expose copper metal, it is necessary to insure that this copper-tin intermetallic also is removed.

Compositions designed to strip tin and/or tin-lead coatings from copper surfaces are known in the art. One class of such compositions includes those based upon hydrogen peroxide and hydrofluoric acid or a fluoride. See, e.g., U.S. Pat. Nos. 3,926,699; 3,990,982; 4,297,257; 4,306,933; 4,374,744 and U.S. Pat. No. 4,673,521. Another class involves those employing nitro-substituted aromatic compounds as a principal ingredient, often in conjunction with an inorganic acid (see, e.g., U.S. Pat. Nos. 3,677,949; 4,004,956; and U.S. Pat. No. 4,397,753) or an organic acid (see U.S. Pat. No. 4,439,338 disclosing the use of alkylsulfonic acids). Other known stripper compositions and processes are described in U.S. Pat. No. 4,424,097 and U.S. Pat. No. 4,687,545. Nitric acid-based strippers also have long been used in the art. See, e.g., the discussion in U.S. Pat. No. 4,713,144, and the use therein of a composition of nitric acid, sulfamic acid and ferric nitrate.

Difficulties arise with all these known stripper compositions. The peroxide-fluoride system is very exothermic and, unless the solution is cooled continuously, temperatures are quickly reached where the peroxide decomposes. Still a further problem with the use of peroxide-fluoride systems in the stripping of lead or tin-lead alloys is the formation of a large volume of lead fluoride sludge which eventually interferes with stripping, requires frequent cleaning of tanks and equipment, and poses significant waste disposal problems.

Strippers based upon nitro-substituted aromatic compounds are prone to redeposition of tin onto the copper from the stripping bath, which can be difficult to remove without excessive attack on the copper, and also are plagued by sludge formation. Nitric acid-based strippers form large volumes of sludge which, apart from the above-noted problems, can become adhered to the surfaces of the copper or to the printed circuit board substrate. Still further, most such systems require two-step processing in order to insure removal of copper-tin intermetallic residing on the copper surface after first removal of tin, lead or tin-lead.

The formation of sludges and the highly corrosive nature of many of these stripper solutions also generally limits their practical use to processes where the surfaces to be treated are dipped or immersed in the solution, i.e., they are incompatible with the equipment which would be used to apply the solutions by a spraying technique.

It is known in the art that the formulation of a tin, lead or tin-lead stripping composition which is capable of economically rapid and complete removal of the tin and/or lead and/or tin-lead and/or tin-copper layers on a copper substrate surface is subject to competing considerations of, on the one hand, sufficient aggressiveness to achieve these purposes while, on the other hand, not so aggressive as to result in any significant attack on the underlying copper substrate itself which could affect its current carrying capacity, adhesion to or coverage of an underlying non-conductive substrate, and the like. To this end, it is known to include in the compositions agents which inhibit copper attack. For example, in U.S. Pat. Nos. 3,926,699 and U.S. Pat. No. 3,990,982, it is stated that ammonia (e.g., in the form of ammonium bifluoride) serves this function in a hydrofluoric acid-hydrogen peroxide stripping composition; U.S. Pat. No. 4,713,144 states that the sulfamic acid in its nitric acid/ferric nitrate/sulfamic acid composition serves as an inhibitor to prevent nitric acid attack on the copper; U.S. Pat. No. 4,297,257 discloses the addition of polyacrylamide for such purpose to a peroxide-fluoride stripping composition; U.S. Pat. No. 4,306,933 discloses the addition of amino acids and certain aromatic carboxylic acids to a peroxide-fluoride stripping composition; and U.S. Pat. No. 4,374,744 discloses heterocyclic nitrogen compounds (e.g., pyrroles, pyrazoles, imidazoles, triazoles) as additives to stripping compositions based upon an oxidizing agent and an inorganic or organic acid.

The inhibiting of a system to prevent its attack on copper can, of course, at the same time unduly inhibit the tin, lead or tin-lead stripping function itself and/or might lead to problems (or additional problems beyond those presented by the stripping materials themselves) in undesirable by-product of sludge formation, stripped metal redeposition, and the like.

SUMMARY OF THE INVENTION

It is a primary object of the present invention to provide a composition useful for the rapid stripping of tin, lead or tin-lead, and any underlying copper-tin alloy, from copper surfaces, without substantial attack on the copper and/or of the insulating substrate on which the copper resides, and without any significant degree of formation of sludge or precipitate or suspended by-products.

Another object of the invention is the provision of a composition of the type described which can be employed by techniques of immersion or spraying.

Yet a further object of the invention is to provide a process for stripping tin, lead or tin-lead, and any underlying copper-tin alloy, from copper surfaces.

These and other objects are achieved by the provision in the present invention of a composition comprised of an aqueous solution containing an alkane sulfonic acid, an inorganic nitrate, and an inhibitor component which is present in an amount effective to minimize attack of the copper surface by the composition while not substantially affecting the speed and efficiency of the stripping process. More particularly, the composition is an aqueous solution containing from about 10 to about 1500 g/l alkane sulfonic acid, from about 1 g/l to about saturation inorganic nitrate, and from about 0.01 to about 1.0% by weight inhibitor component.

In the preferred embodiment of the invention, the alkane sulfonic acid is methane sulfonic acid, the inorganic nitrate is ferric nitrate, and the inhibitor is selected from particular classes of nitrogen-containing compounds.

It has been found that the foregoing composition is effective in rapidly removing tin, lead or tin-lead, and any underlying copper-tin alloy, from copper surfaces in a single application process (either immersion or spraying) without concomitant formation of any sludge or precipitate, and with little if any attack on the underlying copper.

DETAILED DESCRIPTION OF THE INVENTION

In accordance with the invention, a composition and process are provided for stripping tin, lead or tin-lead (solder) from copper surfaces, as well as stripping from the copper surface any copper-tin alloy which has there formed.

As previously noted, the composition is particularly useful in the environment of printed circuit board manufacture where copper circuitry on an insulating substrate has been provided with a tin, lead or tin-lead layer (e.g., by electroplating) incident to the manufacturing process, but then is required to be removed from all or some of the copper surfaces as a further step in manufacture and/or simply in an effort to reclaim copper from a reject board. Generally, the tin, lead or tin-lead layer over the copper will be on the order of .0.0002 to 0.0004 inches thick (0.2 to 0.4 mils) in typical circuit board manufacturing processes. Moreover, for tin or tin-lead, a thin layer or film of copper-tin alloy or intermetallic will form and be present between the copper and the tin or tin-lead layers, generally having a thickness of about 0.002 to about 0.004 mils, which thickness increases with time. The invention is generally applicable, however, to the removal of tin, lead or tin-lead, and any underlying copper-tin alloy, from any copper surface on which the tin, lead or tin-lead has previously been applied, whether or not in the context of printed circuit board manufacture and whether or not the copper in turn is associated with some underlying insulating or conductive substrate.

The invention is applicable to the treatment of copper surfaces on which essentially pure tin or pure lead metal has been deposited or, as is more common, copper surfaces on which tin-lead alloy has been deposited. Tin-lead alloys are interchangeably referred to herein as solder, and may range in tin content from about 1 to 99% by weight, with the balance lead, although most solders commercially employed have a weight ratio of tin:lead of about 60:40. Many such alloys also contain relatively minor amounts of additional metallic species which do not in any event affect the efficacy of the stripping compositions of the invention.

The two essential ingredients of the stripper composition in terms of its functionality in stripping tin, lead or tin-lead and any copper-tin alloy from a copper surface are an alkane sulfonic acid and an inorganic nitrate. Generally speaking, the inorganic nitrate acts upon the tin and/or lead and/or tin-lead and/or copper-tin material to effect its dissolution from the copper surface, while the alkane sulfonic acid serves the function of forming highly water-soluble salts of the dissolved metals, but these ingredients also coact to achieve each of these functions in the expeditious manner and in the absence of precipitate formation which characterize the significant advantages of the composition.

The alkane sulfonic acid for use in the present invention is selected from any one or more compounds having the formula $RSO_3H$, where R is a lower alkyl group having from 1 to 5 carbon atoms, and preferably 1 or 2 carbon atoms, i.e., methane sulfonic acid or ethane sulfonic acid, with methane sulfonic acid most preferred.

The amount of alkane sulfonic acid employed in the aqueous composition will in part depend upon the thickness of tin, lead or tin-lead deposit being removed and the particular alkane sulfonic acid employed. Generally, however, and particularly for methane sulfonic acid, this component will be present in the aqueous composition in an amount ranging from 1 to 100% by volume, more preferably 10 to 50% by volume, and most preferably 10 to 30% by volume, based upon a 70% methane sulfonic acid aqueous solution, which is a form in which methane sulfonic acid commonly is sold. Obviously, however, other concentrations, including the anhydrous form of the acid, can be used in making up the composition, and the above-stated ranges fro the 70% concentration can be readily converted to ranges for other concentrations. Stated in terms of grams of anhydrous alkane sulfonic acid per liter of the overall stripper composition, the concentrations generally will be from about 10 to about 1500 g/l, more preferably from about 95 to about 470 g/l, and most preferably from about 95 to about 285 g/l.

The other essential ingredient of the aqueous stripper composition in terms of stripping functionality is an inorganic nitrate, such terminology being used herein to include nitric acid. Typically such inorganic nitrates are nitric acid, ferric nitrate, and the like, which can be used alone or in admixture in the aqueous composition. Ferric nitrate is preferred in this regard, and is available commercially in a variety of concentrated aqueous solutions (e.g., 45% anhydrous ferric nitrate) or as hydrated crystals. Typically, the amount of ferric nitrate employed in the stripper composition is expressed in terms of anhydrous ferric nitrate, and will range from about 1 g/l up to saturation in the composition, preferably from about 3 g/l to about 150 g/l, and most preferably from about 30 g/l to about 60 g/l. Generally speaking, these same ranges can be employed for other inorganic nitrates, including nitric acid.

Included in the stripping composition of the present invention is an inhibitor component which is functional to minimize attack of the underlying copper substrate by the composition (as compared to that found with the composition without inhibitor) while at the same time not unduly inhibiting the stripping functionality of the composition (again, as compared to that achieved with the composition without inhibitor). Generally speaking, the functional inhibitors are those which, as compared to a control composition without the inhibitor, minimize attack on the copper substrate while not increasing the stripping time more than about three times, but the most preferred inhibitors are those whose addition results in stripping times which are not more than about twice those achieved with a control composition not containing the inhibitor.

Particularly preferred inhibitors are nitrogen-containing organic compounds, or compositions containing them, and most particularly, one or more compounds selected from benzotriazole, alkyl pyridines, substituted or unsubstituted triazines, quaternary ammonium salts, fatty amine salts, ethoxylated amines, and rosin amine derivatives, or compositions containing them. Among the most preferred such inhibitors are keto-amines corresponding to the formula

wherein R is a radical selected from abietyl, hydroabietyl and dehydroabietyl, Y is the group $CH_2R_1$ and X is hydrogen or $CH_2R_1$, wherein $R_1$ represents an alpha ketonyl group (compounds of this type can be manufactured according to the procedures set forth in U.S. Pat. No. 2,758,970 and are available commercially in admixture with small amounts of propargyl alcohol, triphenyl sulfonium chloride, isopropanol and formaldehyde (from the keto-amine forming reaction) under the trade name Rodine 213 (Amchem Products, Inc.)); 1,2,3-benzotriazole; quaternary ammonium chlorides having alkyl, aryl or polyethoxylene organic substituents; alkyl substituted triazines, and particularly in admixture with small amounts of 1,3-diethylthiourea, triphenyl sulfonium chloride (and trace amounts of formaldehyde and orthotoluidine from the triazine preparation reaction) such as available under the trade name Rodine 95 from Amchem Products, Inc.; alkyl pyridines, and particularly in admixture with small amounts of sulfuric acid and 1,3-diethylthiourea such as available under the trade name Rodine 31A from Amchem Products, Inc.; the complex fatty amine salts, and particularly in admixture with 20-30% N,N-dibutylthiourea such as available under trade name Armohib 31 from Akzo Chemicals; and polyethoxylated amines, such as polyethoxylated coco-amines as are available under trade name Chemeen C-2 from Chemax. Also useful are linear alcohol alkoxylates.

Generally, the inhibitor is present in the aqueous stripping composition in an amount of from about 0.01 to about 1.0% by weight, and more typically from about 0.01 to about 0.5% by weight.

For employing the aqueous stripping composition to treat tin, lead or solder-coated copper surfaces to remove the tin, lead or solder therefrom, along with any copper-tin film, so as to expose the copper metal, the surfaces in question are either immersed in the aqueous composition or the composition is sprayed on the surfaces. For typical tin, lead or tin-lead and copper-tin layer thicknesses as earlier described, complete removal generally can be effected after from one to three minutes immersion, or upon spraying for anywhere from about 10 to 30 seconds. For spraying, the aqueous composition is typically continuously recirculated, and of course, for spraying or immersion processes, the aqueous composition can be used to treat a variety of tin- or lead- or tin-lead-coated copper surfaces simultaneously or sequentially until the composition has become exhausted to the point where stripping efficiency becomes uneconomically low.

Generally the aqueous stripping composition can be employed at room temperature, but preferred operation involves temperatures of from about 100° to about 150° F.

As previously noted, the aqueous stripping composition of the present invention possesses a number of significant advantages, most notably its ability to effect tin, lead or tin-lead and copper-tin stripping from copper surfaces rapidly and efficiently, and over repeated cycles of use, without substantial attack on the underlying copper surface and without formation of sludge or precipitates. The stripping of the tin, lead or solder coating as well as the underlying copper-tin alloy can be accomplished in a single step. The composition is stable on make-up and during shipping, storage and use, and neither employs nor generates in use environmentally problematic compounds.

The invention is further described and illustrated with reference to the following examples.

EXAMPLE 1

An aqueous stripping composition was prepared containing 20% by volume of 70% methane sulfonic acid and 80 g/l ferric nitrate nonahydrate. The solution, at room temperature, was used as a control to strip solder from solder-coated (0.3 mil) copper areas of a printed circuit board by immersion of the board in the solution. Complete stripping of the solder and tin-copper alloy was effected in 90 seconds.

The control composition was modified by addition thereto (in the indicated percent by weight) of a number of compounds to determine their effect on the stripping time (time to complete stripping) and, as compared to the results obtained with the control, the effect on attack of the copper substrate (visual determination), with the following results (Table I).

TABLE I

| Additive | Copper Attack (improvement as compared to control) | Stripping Time (seconds) |
|---|---|---|
| Hydroxyquinoline (0.1%) | No improvement | Not determined |
| Bipyridine (0.1%) | No improvement | Not determined |
| Aminopyridine (0.1%) | No improvement | Not determined |
| Salicylaldoxime (0.1%) | No improvement | Not determined |
| Armohib 28 (0.1%) | Slight improvement | 90 |
| Inhibitor 60S (0.1%)[1] | Slight improvement | 90 |
| Mazon RI 325 (0.1%)[2] | No improvement | Not determined |
| Rodine 95 (0.1%) | Significant improvement | 110 |
| Rodine 213 (0.1%) | Significant improvement | 100 |
| Rodine 213 (0.5%) | Significant improvement | 240 |
| Rodine 31A (0.1%) | Significant improvement | 105 |
| Thiourea (0.1%) | Significant improvement | 270 |
| Armohib 31 (0.25%) | Slight improvement | 90 |
| Armohib 31 (0.5%) | Significant improvement | 115 |
| Benzotriazole (0.1%) | Slight improvement | 95 |

TABLE I-continued

| Additive | Copper Attack (improvement as compared to control) | Stripping Time (seconds) |
|---|---|---|
| Benzotriazole (0.2%) | Significant improvement | 150 |

[1] Mixture of 60% ethoxylated (15 mole) C-18 amine, 20% isopropanol and 20% 2-propyn-1-ol neutralized with hydroxyethyl alkylamine, available from Exxon.
[2] Complex blend containing amine borate, available from Mazer Chemical Co.

In an additional test series, the same control was employed (90 second stripping time) and the effect of various inhibitors was as set forth in Table II (all process conditions as before).

TABLE II

| Additive | Copper Attack (improvement as compared to control) | Stripping Time (seconds) |
|---|---|---|
| Chemal LFL-17 (0.1%)[1] | Slight improvement | 105 |
| Chemal LFL-17 (0.2%) | Significant improvement | 115 |
| Chemal LFL-17 (0.3%) | Significant improvement | 120 |
| Chemal LFL-17 (0.4%) | Significant improvement | 230 |
| Chemal LFL-28 (0.1%)[2] | Slight improvement | 105 |
| Chemal LFL-28 (0.2%) | Significant improvement | 105 |
| Chemal LFL-28 (0.3%) | Significant improvement | 110 |
| Chemal LFL-28 (0.4%) | Significant improvement | 120 |

[1] Linear alcohol alkoxylate, available from Chemax.
[2] Linear alcohol alkoxylate, available from Chemax.

In another test series using the same process conditions and the same control (stripping time 105 seconds), the following results were obtained (Table III).

TABLE III

| Additive | Copper Attack (improvement as compared to control) | Stripping Time (seconds) |
|---|---|---|
| Chemal LFL-28 (0.05%) + Benzotriazole (0.05%) | Slight improvement | 150 |
| Chemal LFL-28 (0.05%) + Benzotriazole (0.10%) | Slight improvement | 150 |
| Chemal LFL-28 (0.10%) + Benzotriazole (0.05%) | Significant improvement | 180 |
| Chemal LFL-28 (0.10%) + Benzotriazole (0.10%) | Significant improvement | 180 |
| Chemal LFL-28 (0.20%) + Benzotriazole (0.05%) | Significant improvement | 165 |
| Chemal LFL-28 (0.20%) + Benzotriazole (0.10%) | Significant improvement | 180 |

In another test series using the same process conditions and control (90 second stripping time), the following results were obtained (Table IV) (except as indicated, all additives were employed in varying levels from 0.02% to 0.5% by weight in the stripper solution).

TABLE IV

| Additive | Copper Attack (improvement as compared to control) | Stripping Time (seconds) |
|---|---|---|
| Butoxyne 497[1] | No improvement | Not determined |
| Propargyl Alcohol | No improvement | Not determined |
| Butynediol | No improvement | Not determined |
| Formaldehyde | No improvement | Not determined |
| Dimethylthiourea | No improvement | Not determined |
| Tris Cyclohexyl - hexahydrotriazine | No improvement | Not determined |
| p-Toluidine | No improvement | Not determined |
| Carbowax 7000[2] (0.5%) | No improvement | Not determined |
| Carbowax 7000 (1.0%) | No improvement | Not determined |
| Miranol JS[3] (0.5%) | Slight improvement | Not determined |
| Miranol JS (1.0%) | Significant improvement | >300 |

[1] Mixture of hydroxyethyl ethers of butynediol (GAF Corp.)
[2] Polyoxyethylene glycol (Union Carbide).
[3] Amphoteric surface active agent, a caprylic acid derivative of substituted imidazoline (Miranol Chemical Co.).

In another series of tests, the same process conditions and control were used (90 second stripping time), with the following results (Table V).

TABLE V

| Additive | Copper Attack (improvement as compared to control) | Stripping Time (seconds) |
|---|---|---|
| Chemeen C-2[1] (0.04%) | Significant improvement | 90 |
| Chemeen C-2 (0.12%) | Significant improvement | 90 |
| Mazawet DF[2] (0.04%) | Slight improvement | 95 |
| Mazawet DF (0.12%) | Slight improvement | 210 |
| Chemal LFL-17 (0.04%) | Slight improvement | 90 |
| Chemal LFL-17 (0.12%) | Slight improvement | 120 |
| Chemal LFL-28 (0.04%) | Slight improvement | 90 |
| Chemal LFL-28 (0.12%) | Slight improvement | 120 |

[1] Polyethoxylated cocoamine, available from Chemax.
[2] Alkyl polyoxyalkylene ether (Mazer Chemical Co.).

In further tests using the same process conditions and control (75 second stripping time), the following results were obtained (Table VI).

TABLE VI

| Additive | Copper Attack (improvement as compared to control) | Stripping Time (seconds) |
|---|---|---|
| Mazon 38[1] (0.1%) | Slight improvement | 75 |
| Mazon 38 (0.2%) | Significant improvement | 80 |
| Mazon 38 (0.3%) | Significant improvement | 110 |
| Mazon 269-103[2] | Slight improvement | 120 |
| Mazon 269-103 (0.2%) | Significant improvement | 150 |
| Mazon 269-103 (0.3%) | Significant improvement | 210 |
| Katapone VV-328[3] (0.01%) | Significant improvement | 120 |
| Katapone VV-328 (0.02%) | Significant improvement | 120 |
| Katapone VV-328 (0.04%) | Significant improvement | 120 |
| Katapone VV-328 (0.1%) | Significant improvement | 120 |
| Katapone VV-328 (0.2%) | Significant improvement | 120 |
| Katapone VV-328 (0.3%) | Significant improvement | 135 |

[1] Substituted triazole derivative (Mazer Chemical Co.).
[2] Blend containing an aminosubstituted triazole (Mazer Chemical Co.).
[3] Polyethoxylene quaternary ammonium chloride (GAF Corp.), specifically poly(oxy-1,2-ethanediyl) α, α- [[dodecyl (phenylmethyl)amino] - di - 2,1-ethanediyl] bis [w-hydroxy] chloride; $(C_2H_4O)_n (C_2H_4O)_n C_{23}H_{42}NO_2Cl$.

In another test series using the same process conditions and control stripper (75 seconds stripping time), the following results were achieved (Table VII).

TABLE VII

| Additive | Copper Attack (improvement as compared to control) | Stripping Time (seconds) |
|---|---|---|
| Rodine 52[1] (0.025%) | Slight improvement | 90 |
| Rodine 52 (0.05%) | Significant improvement | 90 |
| Rodine 52 (0.1%) | Significant improvement | 120 |

[1] Mixture of propargyl alcohol (5-15%) and substituted triazine (40-50%) as major component, available from Amchem Products, Inc.

In another test series using the same process and control, but in which the boards had a significantly thicker coating of solder than in the previous test series (control stripping time of 210 seconds), the following results were obtained (Table VIII).

TABLE VIII

| Additive | Copper Attack (improvement as compared to control) | Stripping Time (seconds) |
| --- | --- | --- |
| Ancor LB 504[1] (0.5%) | No improvement | Not determined |
| Reocor 12[2] (0.5%) | No improvement | Not determined |
| Hostacor TP 209[3] (0.5%) | No improvement | Not determined |
| Benzotriazole (0.05%) | Slight improvement | 210 |
| Benzotriazole (0.1%) | Slight improvement | 270 |
| Benzotriazole (0.2%) | Slight improvement | 420 |

[1] A blend of diethanolamine and proprietary fatty acid (Air Products and Chemicals, Inc.).
[2] Half-ester of alkenyl succinic anhydride (Ciba-Geigy).
[3] Derivative of sulfonamido carboxylate (American Hoechst Corp.).

EXAMPLE II

Using the control solution of Example I, several hundred solder-coated printed circuit boards (60 ft² per gallon of stripper solution) were processed through the stripper solution for six minutes each, with additions being made as necessary to maintain the stripper at optimum levels. Upon analysis of the solution, it was found to contain 19.8 g/l copper.

The process was repeated using fresh control solution to which was added 0.18% Rodine 213. After processing the same number of boards as utilized with the control solution, and again with processing for six minutes per board (during which time all solder and copper-tin intermetallic was stripped), the solution contained only 700 ppm copper.

Although the invention has been described with reference to particular features and embodiments, it will be understood that these are not intended as limitations upon the scope of the invention as defined in the appended claims.

What is claimed is:

1. A composition for stripping tin, lead or tin-lead alloy, and any underlying copper tin-alloy, from a copper surface, comprising an aqueous solution of an alkane sulfonic acid, an inorganic nitrate, and an inhibitor effective to minimize attack on the copper surface while not substantially slowing the speed of stripping of said tin, lead or tin-lead alloy and any underlying copper-tin alloy as compared to that obtained without said inhibitor.

2. The composition according to claim 1 wherein said alkane sulfonic acid is present in said aqueous solution in an amount of from about 10 to about 1500 g/l, wherein said inorganic nitrate is present in said aqueous solution in an amount of from about 1 g/l to saturation, and said inhibitor is present in said aqueous solution in an amount of from about 0.01% to about 1.0% by weight.

3. The composition according to claim 2 wherein said alkane sulfonic acid is selected from the group consisting of methane sulfonic acid, ethane sulfonic acid, and mixtures thereof.

4. The composition according to claim 2 wherein said inorganic nitrate is selected from the group consisting of nitric acid, ferric nitrate, and mixtures thereof.

5. The composition according to claim 2 wherein said inhibitor comprises a member selected from the group consisting of benzotriazole, alkyl pyridines, substituted triazines, quaternary ammonium salts, fatty amine salts, rosin amine derivative, ethoxylated amines, and mixtures thereof.

6. The composition according to claim 2 wherein said inhibitor comprises a keto-amine corresponding to the formula

wherein R is a radical selected from the group consisting of abietyl, hydroabietyl and dehydroabietyl; Y is $CH_2R_1$; and X is either hydrogen or $CH_2R_1$, wherein $R_1$ is an alpha ketonyl group.

7. The composition according to claim 6 wherein said inhibitor further comprises propargyl alcohol and triphenyl sulfonium chloride.

8. The composition according to claim 2 wherein said inhibitor comprises 1,2,3-benzotriazole.

9. The composition according to claim 2 wherein said inhibitor comprises a mixture of N,N-dibytylthiourea and a fatty amine salt.

10. The composition according to claim 2 wherein said inhibitor comprises a quaternary ammonium chloride.

11. The composition according to claim 2 wherein said inhibitor comprises an ethoxylated cocoamine.

12. A method for stripping tin, lead or tin-lead alloy, and any underlying copper-tin alloy, from a copper surface, comprising contacting said surface with a composition comprised of an aqueous solution of an alkane sulfonic acid, an inorganic nitrate, and an inhibitor effective to minimize attack of the copper surface while not substantially slowing the speed of stripping of said tin, lead or tin-lead alloy and any underlying copper-tin alloy as compared to that obtained without said inhibitor, for a time sufficient to strip said tin, lead or tin-lead alloy, and any underlying copper-tin alloy, from said copper surface.

13. The method according to claim 12 wherein said contacting is selected from the group consisting of immersing said surface in said solution and spraying said solution on said surface.

14. The method according to claim 12 wherein said copper surface is present as a printed circuit board.

15. The method according to claim 12 wherein said alkane sulfonic acid is present in said aqueous solution in an amount of from about 10 to about 1500 g/l, said inorganic nitrate is present in said aqueous solution in an amount of from about 1 g/l to saturation, and said inhibitor is present in said aqueous solution in an amount of from about 0.01% to about 1.0% by weight.

16. The composition according to any of claims 1 through 11 wherein said inorganic nitrate is ferric nitrate.

17. The method according to and of claims 12 through 15 wherein said inorganic nitrate is ferric nitrate.

* * * * *